(12) United States Patent
Zhang et al.

(10) Patent No.: US 8,838,425 B2
(45) Date of Patent: Sep. 16, 2014

(54) GENERATING FACIES PROBABLITY CUBES

(75) Inventors: Tuanfeng Zhang, Lexington, MA (US);
Ting Li, Arlington, MA (US); Harish Krishnamurthy, Cambridge, MA (US)

(73) Assignee: Schlumberger Technology Corporation, Sugar Land, TX (US)

( * ) Notice: Subject to any disclaimer, the term of this patent is extended or adjusted under 35 U.S.C. 154(b) by 450 days.

(21) Appl. No.: 12/837,936

(22) Filed: Jul. 16, 2010

(65) Prior Publication Data
US 2011/0231164 A1   Sep. 22, 2011

Related U.S. Application Data

(60) Provisional application No. 61/315,098, filed on Mar. 18, 2010.

(51) Int. Cl.
*G06G 7/48* (2006.01)
*G01V 99/00* (2009.01)
*G06F 17/50* (2006.01)

(52) U.S. Cl.
CPC .... *G06F 17/5009* (2013.01); *G01V 2210/6652* (2013.01); *G01V 2210/665* (2013.01); *G01V 99/005* (2013.01)
USPC ............................................. 703/10; 703/9

(58) Field of Classification Search
USPC .......................................................... 703/10
See application file for complete search history.

(56) References Cited

U.S. PATENT DOCUMENTS

| 7,079,953 B2 | 7/2006 | Thorne | |
| 2006/0041409 A1* | 2/2006 | Strebelle et al. | ................ 703/10 |
| 2006/0041410 A1* | 2/2006 | Strebelle | ........................ 703/10 |

OTHER PUBLICATIONS

YStatios, "Gaussian Simulation for Porosity Modeling", 2000, 17 pages.*
Zhang, J. "IRSS: An Integrated Reservoir Simulation System", 2005, 277 pages.*
Remy, N. "Geostatistical Earth Modeling Software: Users Manual", May 2004, 87 pages.*
Deutsch, "GSLIB: Geostatistical software library and user's guide", Applied Geostatistics Series, 1998, Oxford University Press, New York, pp. 138-175.
Journel, "Combining knowledge from diverse sources: An alternative to traditional data independence hypotheses", Mathematical Geology, vol. 34, No. 5, Jul. 2002.
Strebelle, "Conditional simulation of complex geological structures using multiple-point statistics", Mathematical Geology, vol. 34, No. 1, Jan. 2002.

* cited by examiner

*Primary Examiner* — Suzanne Lo

(57) ABSTRACT

A method for generating one or more geological models for oil field exploration. The method includes receiving one or more well facies logs, a vertical facies proportion curve, a lateral proportion map, a variogram model and a global target histogram. The method then includes generating a facies probability cube using a modified Sequential Gaussian Simulation (SGSIM) algorithm, the well facies logs, the vertical facies proportion curve, the lateral proportion map and the variogram model. After generating the facies probability cube, the method includes matching the facies probability cube to the global histogram and generating the geological models based on the matched facies probability cube.

19 Claims, 11 Drawing Sheets

GENERATING FACIES PROBABLITY CUBES

RELATED APPLICATIONS

This application claims priority to U.S. provisional patent application Ser. No. 61/315,098 filed Mar. 18, 2010, titled METHOD FOR RESERVOIR MODELING USING A GEOSTATISTICAL APPROACH TO GENERATE 3D PROBABILITY CUBES OF BINARY FACIES WITH GEOLOGICAL CONSTRAINT, which is incorporated herein by reference.

BACKGROUND

1. Field of the Invention

Implementations of various technologies described herein generally relate to techniques for modeling geological properties of the earth and, more particularly, to techniques for generating facies probability cubes that can be used with multipoint statistics to create a reservoir model.

2. Description of the Related Art

The following descriptions and examples are not admitted to be prior art by virtue of their inclusion within this section.

Geological modeling and reservoir characterization provide quantitative 3D reservoir models based on available reservoir measurements, such as well log interpretations, experimental results from core analysis, seismic survey and dynamic fluid flow responses from field observations (e.g., historic production data) and pressure change data. One type of reservoir characterization or modeling technique is stochastic reservoir modeling.

Stochastic reservoir modeling has gained popularity in modern reservoir modeling software because of its ability to constrain its model based on a variety of reservoir data and its computational efficiency in generating complex reservoir models with millions of voxels. Stochastic reservoir modeling also allows users to quantitatively evaluate uncertainties in the model due to the lack of knowledge of the reservoirs. The data used to constrain the reservoir models in stochastic reservoir modeling are primarily classified into two categories: "hard data" or "soft data." Hard data includes data such as those measured in wells (e.g., well log data), which are considered to be accurate information and should be honored during simulations. Soft data are not as accurate as hard data but typically have larger or better coverage of the reservoir. Facies probability cubes are considered to be soft data that have been derived from seismic attributes using well to seismic calibrations. These types of soft data are important in guiding inter-well facies prediction and thus, they may be used to reduce uncertainties in the decision making process for reservoir management.

Geostatistics provide variety of algorithms and tools to build stochastic reservoir models. Generally, there are two approaches for using geostatistics to build stochastic reservoir models: a pixel-based approach and an object-based approach. The pixel-based approach proceeds by gridding the reservoir into pixels (voxels) and simulating each pixel (voxel) in a random sequence. Unlike the pixel-based approach, the object-based approach directly drops the facies (geobody) objects into the simulated reservoir according to the specified geometric information of these geobodies. The pixel-based approach provides increased flexibility for constraining the model according to reservoir data but it often has poor shape reproduction in the final reservoir models. In contrast, the object-based approach tends to generate more realistic shapes of geobodies; however, it becomes more difficult to constrain the models according to local reservoir observations, particularly when there are dense well locations.

In the pixel-based approach, a sequential indicator simulation (SIS) is often used to create facies models. However, a newly emerging pixel-based approach named Multi-point statistics (MPS) is gaining more attention from modelers and is considered to be part of an advanced facies modeling suite. MPS uses 1D, 2D or 3D "training images" as quantitative templates to model subsurface property fields. MPS modeling captures geological structures from training images and anchors them to data locations. As such, MPS takes advantage of a 2-point (variogram-based) geostatistical approach and an object-based approach to create flexibility in data conditioning while producing more realistic shapes from the training images. MPS can then integrate soft data, such as a facies probability cube, to generate geological or reservoir models. The resulting geological or reservoir models can then be used for oil field explorations by identifying hydrocarbon deposits in the Earth.

In addition to being used in multipoint statistics facies modeling, probability cubes are also used for other modeling approaches, such as object-based modeling and pixel-based Sequential Indicator Simulation (SIS), to further constrain the simulated earth models. As such, facies probability cubes play an important role in geological modeling or reservoir characterization. In particular, facies probability cubes can assist in geological modeling or reservoir characterization when well data is scarce. However, automatically generating facies probability cubes that are geologically sound remains a challenge.

SUMMARY

Described herein are implementations of various technologies for generating facies probability cubes and using the facies probability cubes to generate geological models for oil field exploration. In one implementation, a method generating geological models may include receiving one or more well facies logs, a vertical facies proportion curve, a lateral proportion map, a variogram model and a global target histogram. The method may then include generating a facies probability cube using a modified Sequential Gaussian Simulation (SGSIM) algorithm, the well facies logs, the vertical facies proportion curve, the lateral proportion map and the variogram model. After generating the facies probability cube, the method may match the facies probability cube to the global histogram and generate the geological models based on the matched facies probability cube.

The claimed subject matter is not limited to implementations that solve any or all of the noted disadvantages. Further, the summary section is provided to introduce a selection of concepts in a simplified form that are further described below in the detailed description section. The summary section is not intended to identify key or essential features of the claimed subject matter, nor is it intended to be used to limit the scope of the claimed subject matter.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

DETAILED DESCRIPTION

Figure 1:
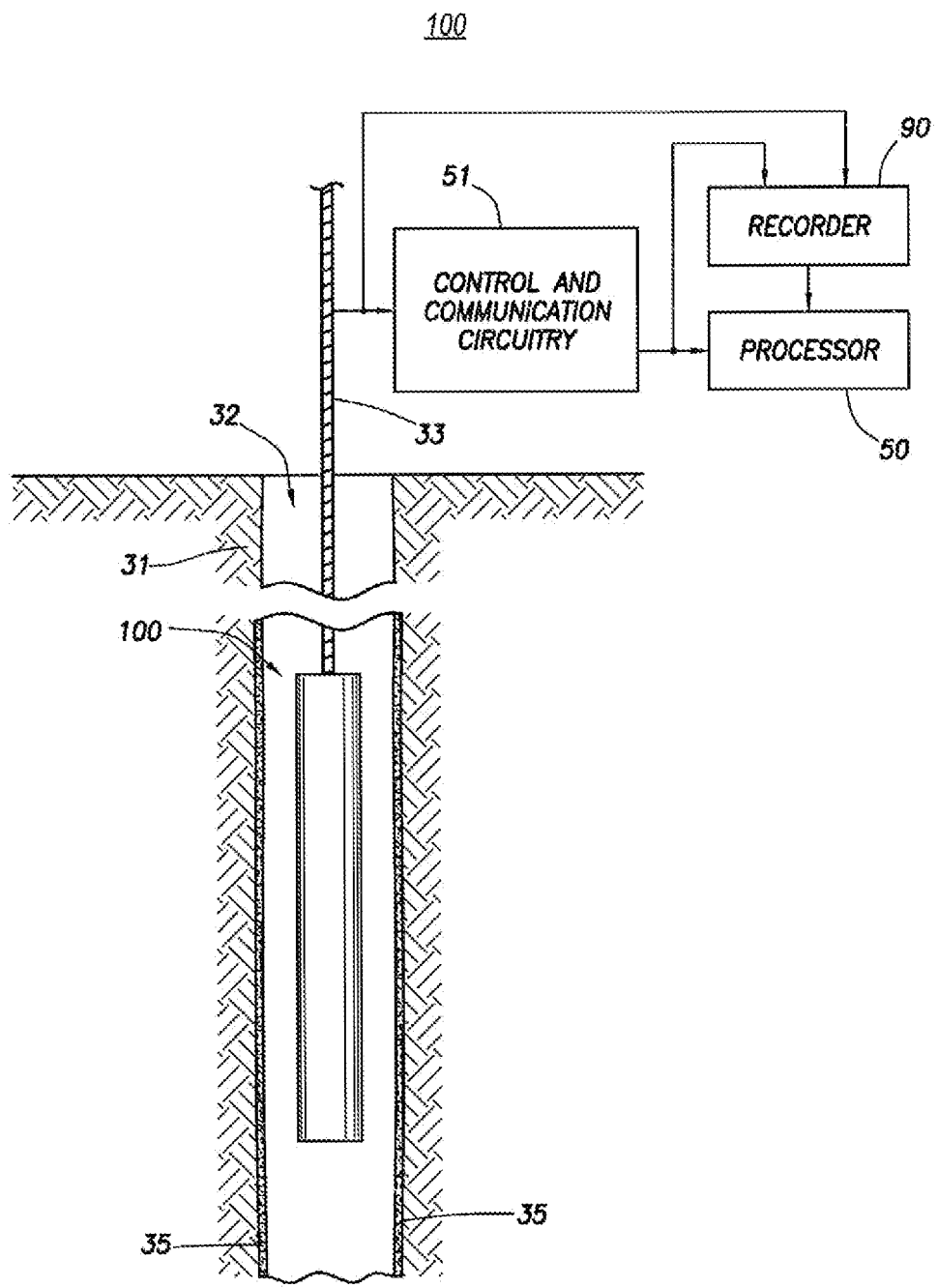
FIG. 1 illustrates a schematic diagram of a logging apparatus in accordance with implementations of various techniques described herein.

The discussion below is directed to certain specific implementations. It is to be understood that the discussion below is only for the purpose of enabling a person with ordinary skill in the art to make and use any subject matter defined now or later by the patent "claims" found in any issued patent herein.

The following provides a brief description of various technologies and techniques for generating facies probability cubes. In one implementation, a computer application may receive a vertical facies proportion curve, a lateral proportion map, a variogram model and a global target histogram to generate the facies probability cube. The vertical proportion curve may indicate the amount in which the facies deposits change within varying depths. The lateral proportion map may be a 2 dimensional map in the XY plane that represents the variation of lateral proportions of certain facies in terms of an average proportion along the Z direction. The variogram model may be a quantitative tool in conventional 2-point geostatistics that measures the spatial variability of a geovariable. Generally, the vertical facies proportion curve and the lateral proportion may be determined based on well facies data in well facies logs. The variogram model may be determined based on an automatic or computerized interpretation of the well facies data or it may be received from a user based on his/her interpretation of the well facies data or other relevant data. The global target histogram may be received from a user and may be defined as probability distribution such as a U-shaped beta distribution.

After receiving the vertical facies proportion curve, the lateral proportion map, the variogram model and the global target histogram, the computer application may generate a facies probability cube using a modified Sequential Gaussian Simulation (SGSIM) algorithm. The modified SGSIM algorithm may use the vertical facies proportion curve, the lateral proportion map and the variogram model to estimate facies proportions in a facies probability cube. The modified SGSIM algorithm may estimate the facies probability cube by increasing or reducing a kriging mean based on the vertical facies proportion curve (VPC) and the lateral proportion map (LPM). The adjustment with regard to the vertical facies proportion curve (VPC) and the lateral proportion map (LPM) may be performed based on the following formula:

$$m_{sk}^{*new}(i, j, k) = m_{sk}^{*}(i, j, k) + \frac{\lambda}{1-\lambda}\left(\frac{VPC(k) - p^{*}(k)}{\sigma_T}\right) + \frac{\lambda}{1-\lambda}\left(\frac{LPM(i, j) - p^{*}(i, j)}{\sigma_T}\right)$$

where $m_{sk}^{*}(i, j, k)$ is kriging mean at pixel $(i, j, k)$, $p(k)^{*}$ is running proportion of the facies at the k-th Z-layer, $VPC(k)$ is proportion read at the k-th Z-layer from the VPC, $\lambda$ is a servo factor in $[0, 1]$ that indicates the correction strength, $m_{sk}^{*new}(i, j, k)$ is adjusted kriging mean, $\sigma_T$ is the standard deviation of the global target histogram, i.e., $\sigma_T = \sqrt{c \times p \times (1-p)}$ and $LPM(i, j)$ is lateral proportion at pixel location $(i, j)$, which can be read from the LPM, and $p^{*}(i, j)$ is a running facies proportion calculated from the column at $(i, j)$. After generating the facies probability cube, the computer application may perform an inverse normal score transform on the facies probability cube in a Gaussian space to match the global target histogram.

FIGS. 1-15 illustrate one or more implementations of various techniques described herein in more detail.

FIG. 1 illustrates a schematic diagram of a logging apparatus in accordance with implementations of various techniques described herein. FIG. 1 shows a borehole 32 that has been drilled in formations 31 with drilling equipment, and typically, using drilling fluid or mud that results in a mudcake represented at 35. A logging device 100 is shown, and can be used in connection with various implementations described herein. The logging device 100 may be suspended in the borehole 32 on an armored multiconductor cable 33. Known depth gauge apparatus (not shown) is provided to measure cable displacement over a sheave wheel (not shown) and thus the depth of logging device 100 in the borehole 32. Circuitry 51, represents control and communication circuitry for the investigating apparatus. Although circuitry 51 is shown at the surface, portions thereof may typically be downhole. Also shown at the surface are processor 50 and recorder 90. Although logging device 100 illustrated herein is shown to be a wireline logging tool, it should be noted that other tools such as a logging while drilling tool may be used in connection with various implementations described herein.

The logging device 100 may represent any type of logging device that takes measurements from which formation characteristics can be determined, for example, by solving complex inverse problems. The logging device 100 may be an electrical type of logging device (including devices such as resistivity, induction, and electromagnetic propagation devices), a nuclear logging device, a sonic logging device, or a fluid sampling logging device, or combinations thereof. Various devices may be combined in a tool string and/or used during separate logging runs. Also, measurements may be taken during drilling and/or tripping and/or sliding. Examples of the types of formation characteristics that can be determined using these types of devices include: determination, from deep three-dimensional electromagnetic measurements, of distance and direction to faults or deposits, such as salt domes or hydrocarbons; determination, from acoustic shear and/or compressional wave speeds and/or wave attenuations, of formation porosity, permeability, and/or lithology; determination of formation anisotropy from electromagnetic and/or acoustic measurements; determination, from attenuation and frequency of a rod or plate vibrating in a fluid, of formation fluid viscosity and/or density; determination, from resistivity and/or nuclear magnetic resonance (NMR) measurements, of formation water saturation and/or permeability; determination, from count rates of gamma rays and/or neutrons at spaced detectors, of formation porosity and/or density; and determination, from electromagnetic, acoustic and/or nuclear measurements, of formation bed thickness.

In one implementation, the measurements obtained by logging device 100 may include well facies data in the well logs (facies logs). Facies logs may indicate the absolute presence or absence of a targeted facies at different spatial locations. Targeted facies may include channels, levees, crevasses, shale background and the like.

Figure 2:
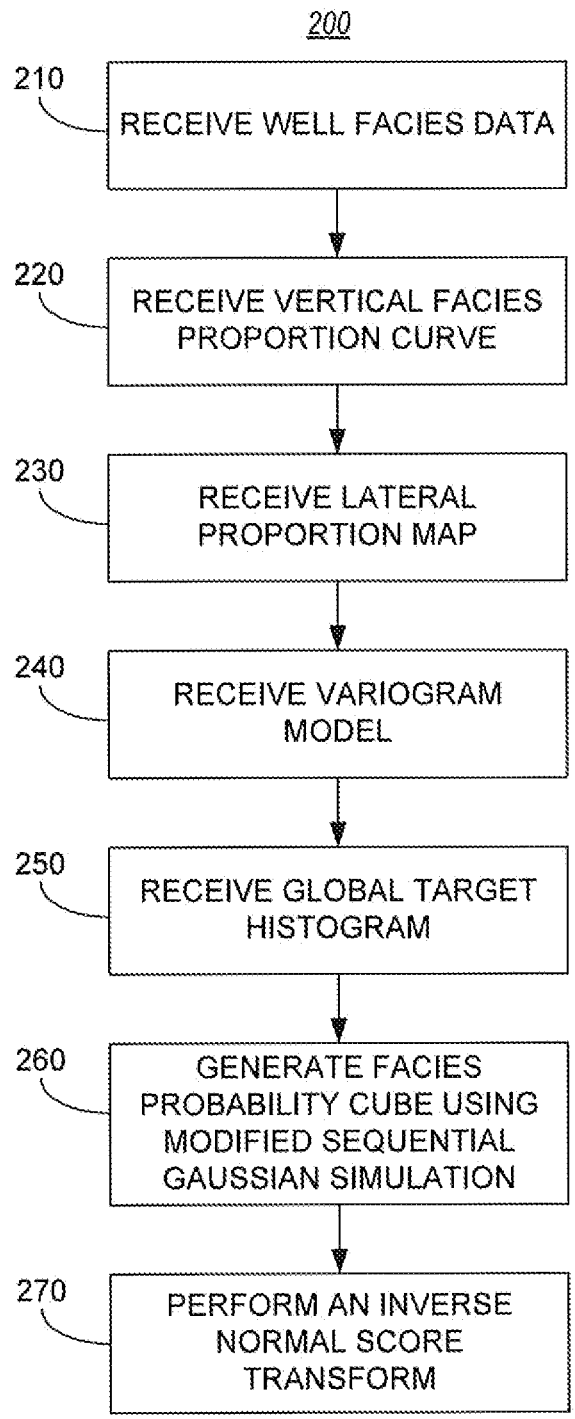
FIG. 2 illustrates a flow diagram of a method for generating a facies probability cube in accordance with implementations of various techniques described herein.

FIG. 2 illustrates a flow diagram of a method 200 for generating a facies probability cube in accordance with implementations of various techniques described herein. In one implementation, method 200 may be performed by a computer application. The following description of method 200 is made with reference to method 500 of FIG. 5 and diagram 1500 of FIG. 15. It should be understood that while method 200 indicates a particular order of execution of the operations, in some implementations, certain portions of the operations might be executed in a different order.

At step 210, the computer application may receive well facies data from well facies logs. Well facies logs may be well logs that have been acquired at various locations in a survey area such as boreholes and the like, as described above with reference to FIG. 1. Well facies logs may indicate the absolute presence or absence of a targeted facies at different spatial locations. An example of well facies data is provided in FIG. 9.

Figure 7:
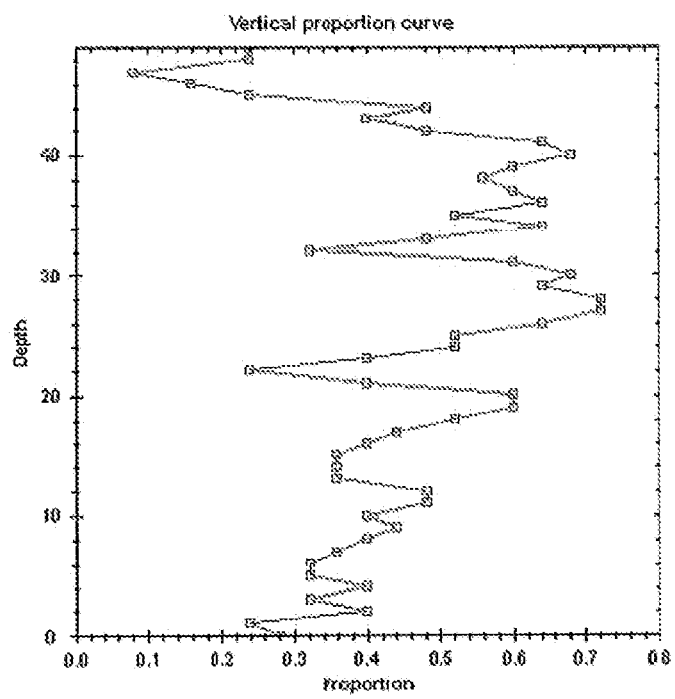
FIG. 7 illustrates an example of a vertical proportion curve in accordance with implementations of various techniques described herein.
Figure 15:
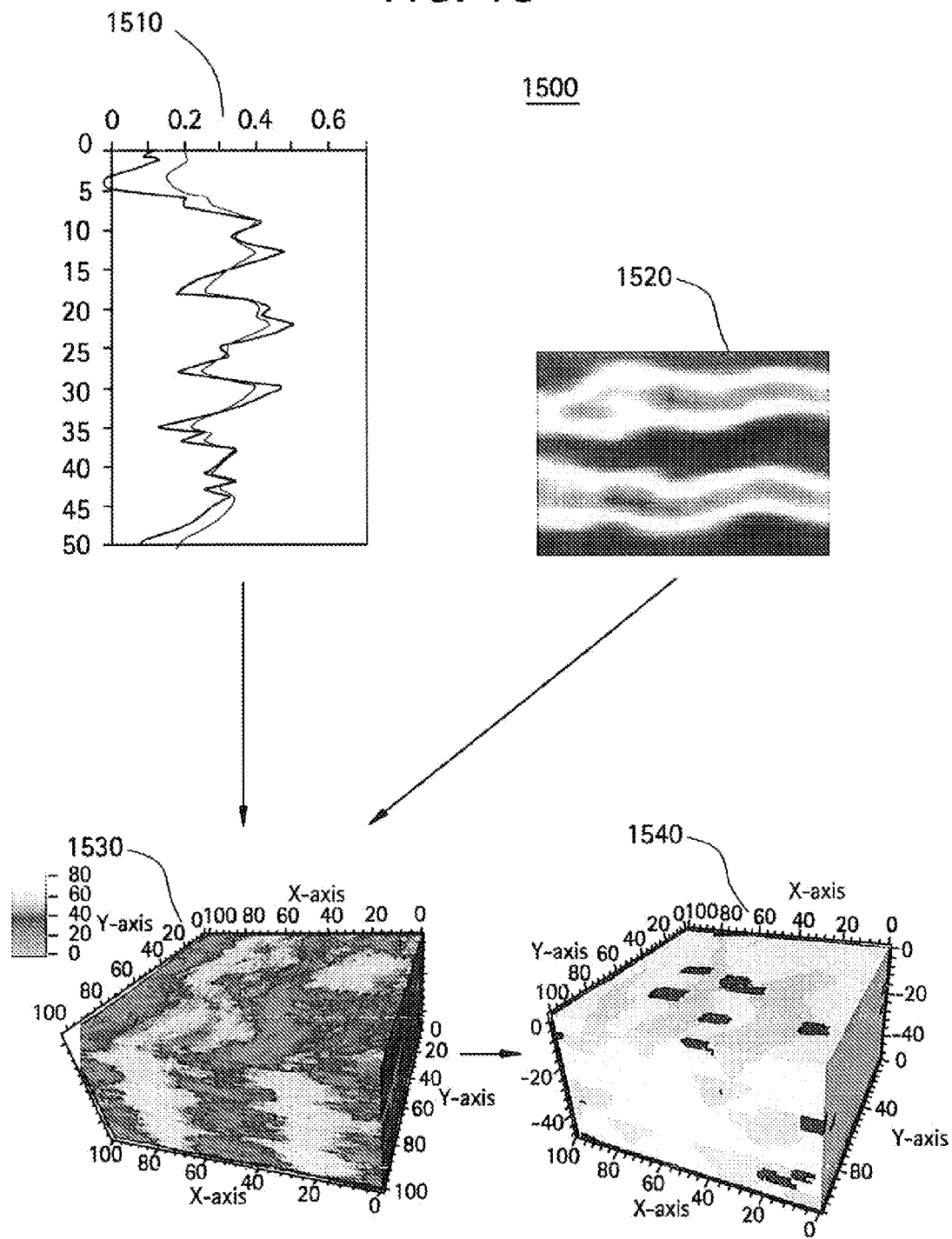
FIG. 15 illustrates a diagram for creating a reservoir model in accordance with implementations of various techniques described herein.

At step 220, the computer application may receive a vertical facies proportion curve (VPC). FIG. 7 illustrates an example of a VPC. FIG. 15 illustrates how the VPC 1510 may be used in method 200. The VPC may illustrate the change of facies deposits in the earth with the variation of depths. The change of facies deposits in the earth may occur due to a geological sedimentation process, which may evolve periodically as progradation and retrogradation patterns. These patterns may result when sea levels rise and drop alternatively. This phenomenon is ubiquitous in sequence stratigraphy at large scales, but the cyclical nature of the patterns may also be found at small scales. As such, the amount of specific facies deposits changes with the variation of geological times or depths leading to a systematic vertical trend of facies proportions. For example, in a fluvial-dominated deltaic environment, the sand deposit may be high at the bottom of a reservoir unit, become lower in the middle of the reservoir unit and becomes high again at the top of the reservoir unit. Coarsening or fining upwards characteristics in geological deposition for a certain facies is also a trend indicator of the deposition of that facies.

In one implementation, VPC can be calculated from well facies logs (from step 210) interpretation, geological conceptual models or analogs similar to the reservoir under study. If well facies data are available, the well facies data may be combined with geological interpretations of the seismic area to generated interpreted well facies data. The interpreted well facies data may then be used as anchors in generating facies probability cubes, i.e. they indicate the absolute presences/absences of the targeted facies at different spatial locations: probability is 1 for its presence and 0 for its absence. The vertical facies proportion curve can be calculated by extracting the facies proportion along each vertical layer (i.e., Z-layer) of a modeling grid. In case of very sparse wells, the calculated proportion curve may not be reliable and hence, its modification and editing may be performed based on geological interpretations or analogs similar to the studied reservoir.

Figure 8:
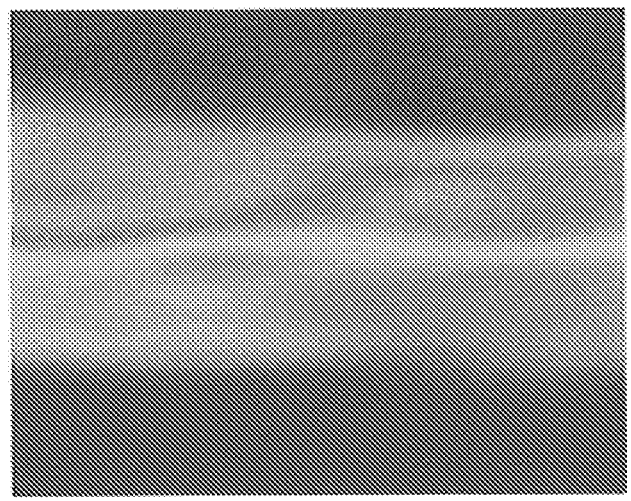
FIG. 8 illustrates an example of a lateral proportion map in accordance with implementations of various techniques described herein.
Figure 9:
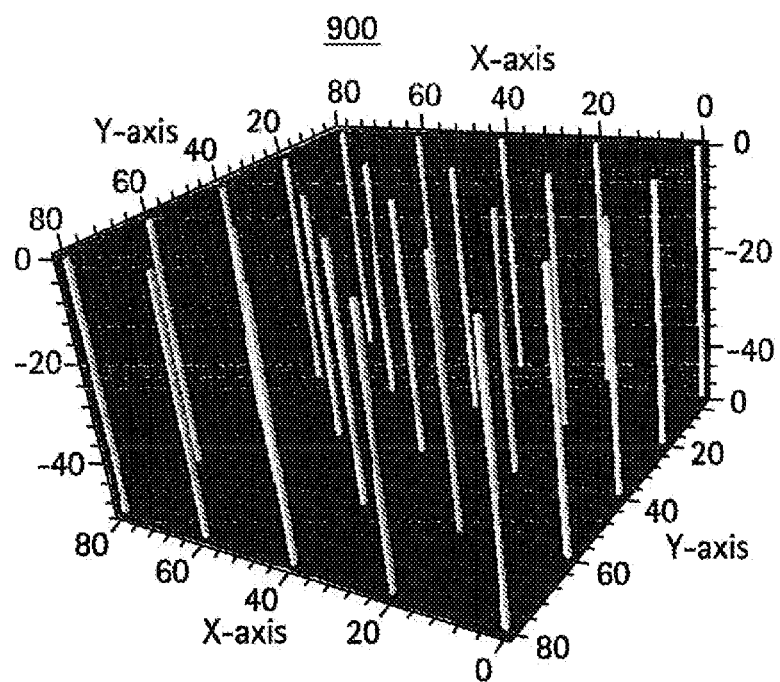
FIG. 9 illustrates an example of well facies data in accordance with implementations of various techniques described herein.

At step 230, the computer application may receive a lateral facies proportion map (LPM). FIG. 8 illustrates an example of a LPM. FIG. 15 illustrates how the LPM 1520 may be used in method 200. The lateral proportion map may be a 2 dimensional map in the XY plane that represents the variation of lateral proportions of certain facies in terms of an average proportion along the Z direction. In this manner, the lateral proportion map may illustrate lateral trends such as progradation or transition. In one implementation, the computer application may obtain the lateral facies proportion map by interpolating facies proportion from each well facies log or by calibrating seismic interpretations of each well facies log. The information included in the lateral facies proportion map may be useful when facies depositions have apparent lateral trends, such as progradation or a transition as observed from received seismic data, well facies log interpretations or conceptual models.

The computer application may create lateral proportion maps based on well facies data using any smooth interpolator, such as a kriging technique in 2-point geostatistics or moving averaging algorithms. For instance, at each well location, the computer application may calculate a facies proportion. The facies proportion value may then be considered to be one of the hard data used as an anchor point to control the smooth interpolator. In one implementation, the computer application may also add interpreted trends into the LPM by adding data from "pseudo" wells. In any case, by integrating LPM into reservoir modeling, the computer application may be able to generate a facies probability cube that has more realistic results.

At step 240, the computer application may receive a variogram model from a user. The variogram model may be a quantitative tool in conventional 2-point geostatistics that measures the spatial variability of a geo-variable. The variogram model may be used to control the anisotropy of the spatial distribution of a geo-variable by changing the correlation ranges and the orientations of major/minor axis of the variogram model. As such, the variogram model may be specified by a user to govern the an isotropic distribution of probability values in the facies probability cube.

The variogram model may be derived by the computer application based on well facies data or may be specified by a user based on his/her interpretation of the well facies data or other relevant data. If the variogram model is derived by the computer application, the computer application may derive the variogram model from the vertical facies proportion curve and the lateral facies proportion map. The vertical facies proportion curve may be used to infer the vertical range of the variogram model, and the lateral facies proportion map may be used to infer the horizontal correlations of the variogram model. If a local azimuth field that reflects the orientation of facies deposition is available, the computer application may also use the local azimuth field to build the variogram model.

Generally, the computer application may receive one of four commonly used variogram models: spherical, exponential, Gaussian and power variograms. It has been shown that the Gaussian variogram model, as compared with the other three variogram models, may create smoother results in generating the facies probability cube and therefore may be more suitable to generate facies probability cubes. However, it should be noted that method 200 described herein is not limited to the Gaussian variogram model.

At step 250, the computer application may receive a global target histogram from a user. The global target histogram may be a probability distribution used to constrain the facies probability cube. In one implementation, the global target histogram may be a U-shaped beta distribution. As such, the two end peaks of the U-shaped beta distribution may correspond to the likelihood of facies presence/absence in the entire probability cube. Additionally, the mean of the Beta distribution may be forced to match the global facies proportion in the reservoir while the variance of the Beta distribution may be a user-defined parameter that allows the user to control the variation or "sharpness" of the resulting probability cube.

The probability density function (PDF) of Beta distribution is defined in classic statistics as:

$$f(x, \alpha, \beta) = \frac{x^{\alpha-1}(1-x)^{\beta-1}}{\int_0^1 u^{\alpha-1}(1-u)^{\beta-1} du}$$
$$= \frac{\Gamma(\alpha+\beta)}{\Gamma(\alpha)\Gamma(\beta)} x^{\alpha-1}(1-x)^{\beta-1}$$
$$= \frac{1}{B(\alpha, \beta)} x^{\alpha-1}(1-x)^{\beta-1}$$

where $\Gamma$ is the gamma function. The expected value, second moment and variance of a Beta random variable X with parameters $\alpha$ and $\beta$ are:

$$E(X) = \frac{\alpha}{\alpha+\beta}$$
$$E(X^2) = \frac{\alpha(\alpha+1)}{(\alpha+\beta)(\alpha+\beta+1)}$$
$$\text{Var}(X) = \frac{\alpha\beta}{(\alpha+\beta)^2(\alpha+\beta+1)}$$

To match a specified global facies proportion (p) and a user-defined tuning factor (c), the following relationships may be established:

$$E(X) = p$$

$$\text{Var}(X) = c \times p \times (1-p)$$

where $0.5 < c \le 1.0$; $0 < p \le 0.5$. The specified global facies proportion (p) denotes the proportion of a particular facies in the facies probability cube, and the user-defined tuning factor or parameter controlled contrast (c) is associated with the variance or spread of the Beta distribution. The link between the two parameters p and c and the two parameters $\alpha$ and $\beta$ in Beta distribution is defined as:

$$\alpha = p \times \frac{1-c}{c}; \beta = (1-p) \times \frac{1-c}{c}$$

Figure 11:
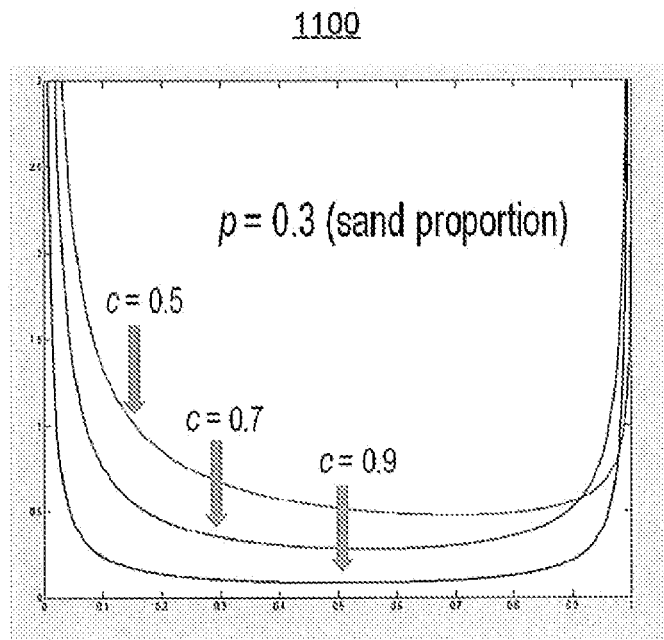
FIG. 11 illustrates an example of two Probability Density Function (PDF) curves of a Beta distribution for different parameter controlled contrasts in accordance with implementations of various techniques described herein.

This equation ensures $0 < \alpha < \beta < 1.0$. As a result, the two peaks of the PDF of the Beta distribution occurs at x=0 and at x=1.0 such that the peak at x=0 is higher than the peak at x=1.0 because the target facies proportion p is less than 0.5. If, however, the target facies proportion is more than 0.5, the complementary facies of the target facies may need to be considered to ensure that $0 < \alpha < \beta < 1.0$. Additionally, if c increases from 0.5 to 1.0, the facies probability cube may tend to include more contrast. The largest contrast is reached when c=1.0, which means that every value in the probability cube is either 1 or 0 and thus the probability cube becomes a binary cube. FIG. 11 illustrates an example of two Probability Density Function (PDF) curves of a Beta distribution for different parameter controlled contrasts c, which may control the spread of the Beta distribution.

In one implementation, if the global target histogram is a U-shaped beta distribution as described above, the computer application may also receive the parameter controlled contrast (c) for the beta distribution. Although the global target histogram has been described as a U-shaped beta distribution, it should be understood that in other implementations the global target histogram may be a different type of distribution.

At step 260, the computer application may generate a facies probability cube using a modified Sequential Gaussian Simulation (SGSIM) algorithm. The conventional Sequential Gaussian Simulation (SGSIM) algorithm, as described in Deutsch, C. V. and Journel, A. G., 1998, GSLIB: Geostatistical Software Library and User's Guide. Oxford University Press, New York, p. 369 (Deutsch and Journel, 1998), is a popular geostatistical algorithm that is used to simulate a petrophsyical properties distribution of any continuous variable, such as porosity or permeability in a model (i.e., facies probability cube). It is a pixel-based sequential simulation approach under a multi-Gaussian assumption.

Figure 12:
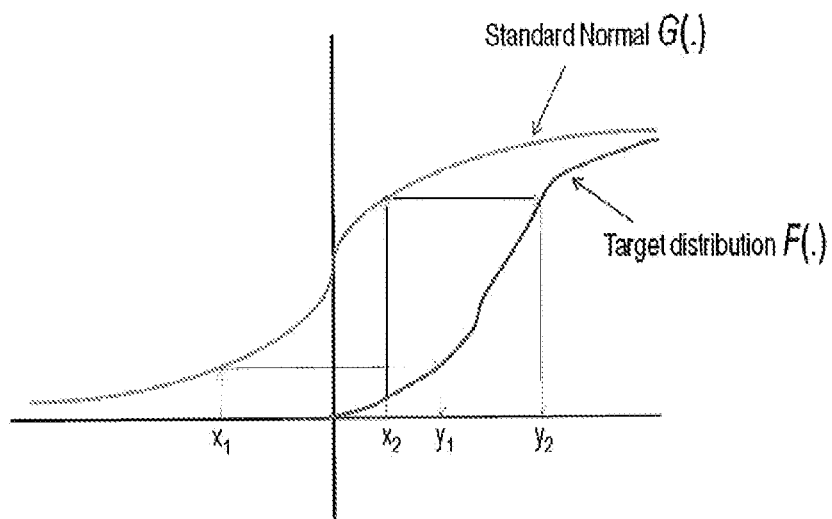
FIG. 12 illustrates an example of a Cumulative Density Function (CDF) curve in an original probability space and a CDF curve in a normal score space in accordance with implementations of various techniques described herein.

The SGSIM algorithm first transforms well log data into standard normal values using a process called normal score transformation. The well log data is transferred into standard normal values for practical purposes because the continuous variables may not follow a Gaussian distribution. FIG. 12 illustrates an example of a Cumulative Density Function (CDF) curve in the original probability space and a CDF curve in the normal score space. The algorithm then proceeds by selecting a random pixel (or voxel in 3D) in a model. Because of the multi-Gaussian assumption, the SGSIM algorithm may make a determination of a conditional cumulative density function (ccdf) at the selected pixel to determine the probability of the existence of a continuous variable at the selected pixel location. In order to make the determination of the conditional cumulative density function (ccdf) at the selected pixel, the SGSIM algorithm solves a local kriging system to obtain an estimated kriging mean and variance based on well data obtained from well logs that are within the neighborhood of the selected pixel in the model. The SGSIM algorithm then constructs a normal distribution at the selected pixel using the estimated kriging mean and variance. After constructing the normal distribution at the selected pixel, the SGSIM algorithm may add the normal distribution value to the model at the selected pixel. This process is then repeated for each pixel in the model until all of the pixels have been selected.

After applying the SGSIM algorithm to each pixel in the model in the standard normal space, a simulation of the original (probability) variable may be obtained by performing a back transformation of the normal score model to the original space. By using the conventional SGSIM algorithm, the variogram model is used to control the spatial anisotropic distribution of the (probability) variable and a global target histogram of the original variable is forced to be reproduced during the back transformation.

Figure 5:
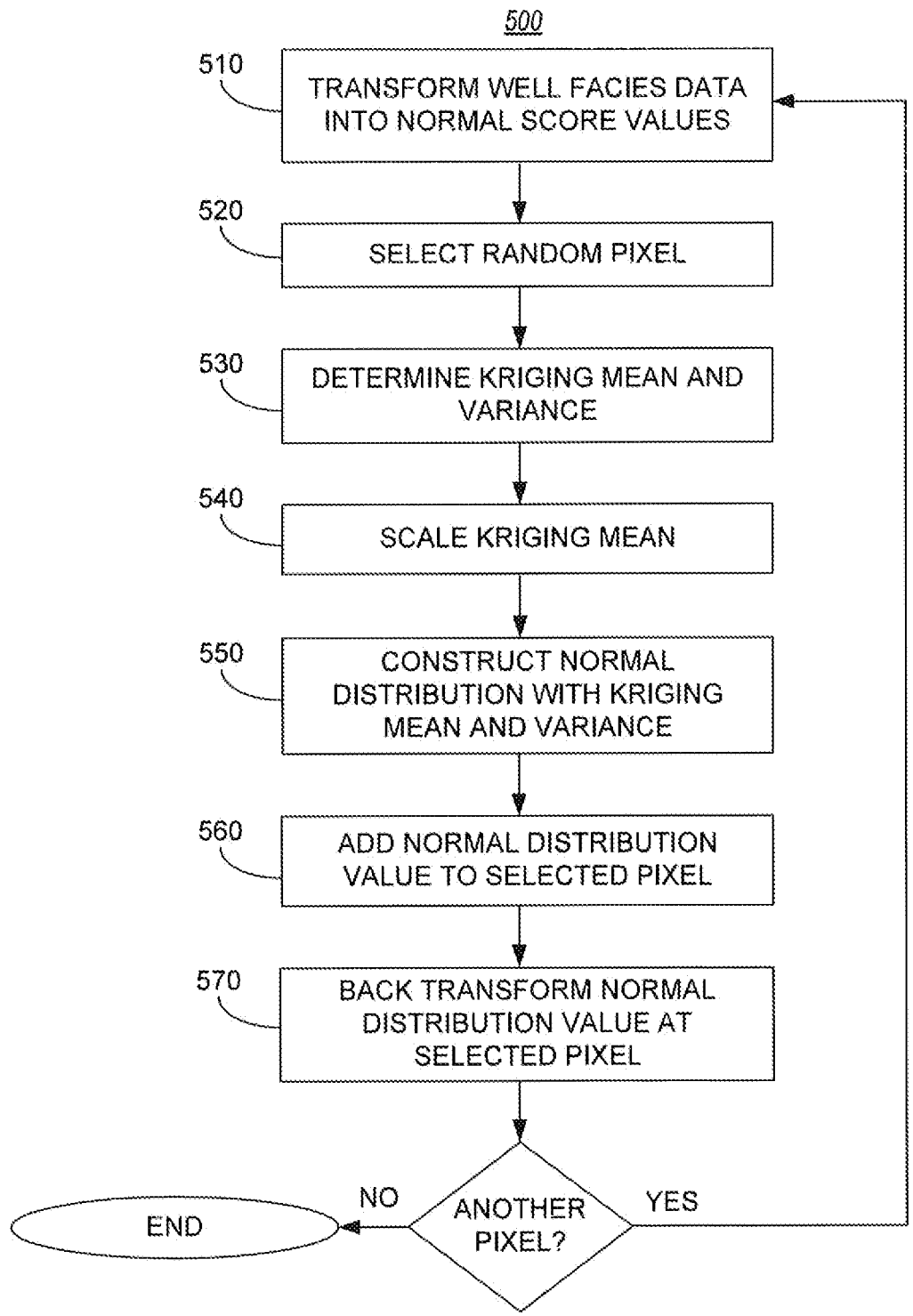
FIG. 5 illustrates a flow diagram of a method for performing a modified Sequential Gaussian Simulation (SGSIM) algorithm in accordance with implementations of various techniques described herein.

FIG. 5 illustrates a flow diagram of a method 500 for performing a modified Sequential Gaussian Simulation (SGSIM) algorithm in accordance with implementations of various techniques described herein. The following description of method 500 describes the process used at step 260 of method 200. The modified SGSIM algorithm is a variation of the conventional SGSIM algorithm that may be used to create facies probability cubes such that the facies probability cubes are constrained by the vertical facies proportion curve, the lateral proportion map, the variogram model and the global target histogram received at steps 220-250. Like the conventional SGSIM algorithm, the modified SGSIM algorithm may first transform well log data into standard normal values using a process called normal score transformation. (Step 510). The modified SGSIM algorithm may then select a random pixel (or voxel in 3D) in a model of the facies probability cube. (Step 520). Next, in the simulation stage, the modified SGSIM algorithm may solve a local kriging system at the selected pixel to determine a kriging mean $m_{sk}^*$ and a kriging variance $\sigma^2_{sk}$ based on well data obtained from well logs that are within the neighborhood of the selected pixel in the model. (Step 530).

Up to this step, all the procedures remain the same as the traditional SGSIM algorithm. However, in order to constrain the facies probability cube to the vertical proportion curve, the modified SGSIM algorithm may increase or decrease the kriging mean $m_{sk}^*$ according to the difference between a running facies proportion and a target facies proportion at the Z-layer at selected pixel. (Step 540). The running facies proportion is defined as the simulated facies proportion before the simulation reaches the selected pixel, and the target facies proportion is the proportion value of the target facies at the selected pixel as indicated from the vertical proportion curve. In order to calculate the running proportion, the computer application may perform a back transformation of the simulated pixels from the normal score values into the original probability space.

In one implementation, the modified SGSIM algorithm is configured to increase or decrease the kriging mean $m_{sk}^*$ without changing the kriging variance. As such, the chance for drawing a larger or smaller probability value in the original space will be high unless the kriging variance is also scaled. In order to scale the kriging mean $m_{sk}^*$ without changing the kriging variance, the modified SGSIM algorithm may progressively adjust the kriging mean $m_{sk}^*$ at each pixel to match the vertical proportion curve. The adjustment with regard to the vertical facies proportion curve (VPC) is performed based on the following formula:

$$m_{sk}^{*new}(i, j, k) = m_{sk}^*(i, j, k) + \frac{\lambda}{1-\lambda}\left(\frac{VPC(k) - p^*(k)}{\sigma_T}\right) \quad \text{(Equation 1)}$$

where $m_{sk}^*$ (i, j, k) is the kriging mean at pixel (i, j, k), p (k)* is running proportion of the facies at the k-th Z-layer, VPC(k) is the proportion read at the k-th Z-layer from the VPC, $\lambda$ is a servo factor in [0, 1] that indicates the correction strength, $m_{sk}^{*new}$(i, j, k) is the adjusted kriging mean, and $\sigma_T$ is the standard deviation of the global target histogram, i.e., $\sigma_T = \sqrt{c \times p \times (1-p)}$.

As shown in equation 1 above, if the running facies proportion at the k-th Z-layer is larger than the target vertical proportion, the kriging mean will be reduced. Alternatively, if the running facies proportion at the k-th Z-layer is smaller than the target vertical proportion, the kriging mean will be increased. As a result, a smaller or a larger normal score value will likely be used to gear the simulated probability values in the original space towards the final facies probability cube such that they match the input vertical proportion curve.

If the servo factor $\lambda$ is 0, the modified SGSIM algorithm does not make a correction to the probability values. A larger servo factor (i.e., approaching 1.0), however, corresponds with a stronger correction factor for the reproduction of the vertical proportion curve in the resulting facies probability cube. When the vertical proportion curve has an erratic variation cycle or trend, it may compromise the resulting probability spatial continuity, which is typically governed by the variogram model. Therefore, a reasonable selection of the servo factor is used to balance a trade-off between the vertical proportion curve trend reproduction and the variogram model.

In addition to making the adjustment to the kriging mean $m_{sk}^*$ with regard to the vertical facies proportion curve, the modified SGSIM algorithm may also make an adjustment to the kriging mean $m_{sk}^*$ with regard to the lateral proportion map based on the following formula:

$$m_{sk}^{*new}(i, j, k) = m_{sk}^*(i, j, k) + \frac{\lambda}{1-\lambda}\left(\frac{VPC(k) - p^*(k)}{\sigma_T}\right) + \frac{\lambda}{1-\lambda}\left(\frac{LPM(i, j) - p^*(i, j)}{\sigma_T}\right) \quad \text{(Equation 2)}$$

where LPM(i, j) is lateral proportion at pixel location (i, j), which can be read from the LPM, and p*(i, j) is the running facies proportion calculated from the column at (i, j). Based on equation 2, the modified SGSIM algorithm may constrain the facies probability cube according to the vertical proportion curve and the lateral proportion map. (Step 550).

It should be noted that two different servo factors could be used in equation 2, but by keeping the two servo factors the same the input parameters of the algorithm may be simplified.

After scaling the kriging mean $m_{sk}^*$, the modified SGSIM algorithm may construct a normal distribution at the selected pixel using the estimated kriging mean and variance. (Step 550). After constructing the normal distribution at the selected pixel, the modified SGSIM algorithm, like the conventional SGSIM algorithm, may add the normal distribution value to the model at the selected pixel. (Step 560). The modified SGSIM algorithm may then back transform the value at the selected pixel to the target space and update the running proportions. (Step 570). This process is then repeated for each pixel in the model until all of the pixels have been selected.

Figure 10:
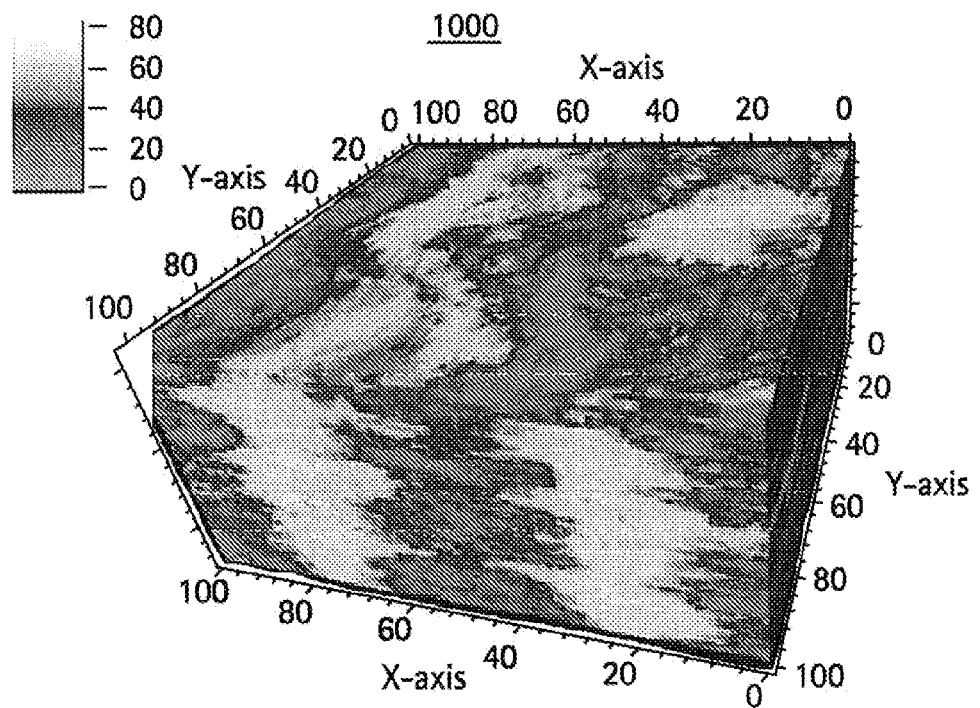
FIG. 10 illustrates an example of a fluvial sand probability cube in accordance with implementations of various techniques described herein.

At step 270, the computer application may perform an inverse normal score transform in Gaussian space to the facies probability cube generated at step 260 in order to match the global target histogram received at step 250. FIG. 10 illustrates an example of a fluvial sand probability cube generated using method 200. FIG. 15 illustrates how the fluvial sand probability cube 1530 may have been generated using the VPC 1510 and the LPM 1520 as described in method 200.

In one implementation, the modified SGSIM algorithm may require that consistency exists between the three inputs: global facies mean (p), vertical proportion curve and lateral proportion map. The consistency means both the average of the vertical proportion curve and the average of the lateral proportion map may be close to the global mean (p). Otherwise, the resulting probability cubes do not guarantee the reproduction of the input constraints.

Figure 3:
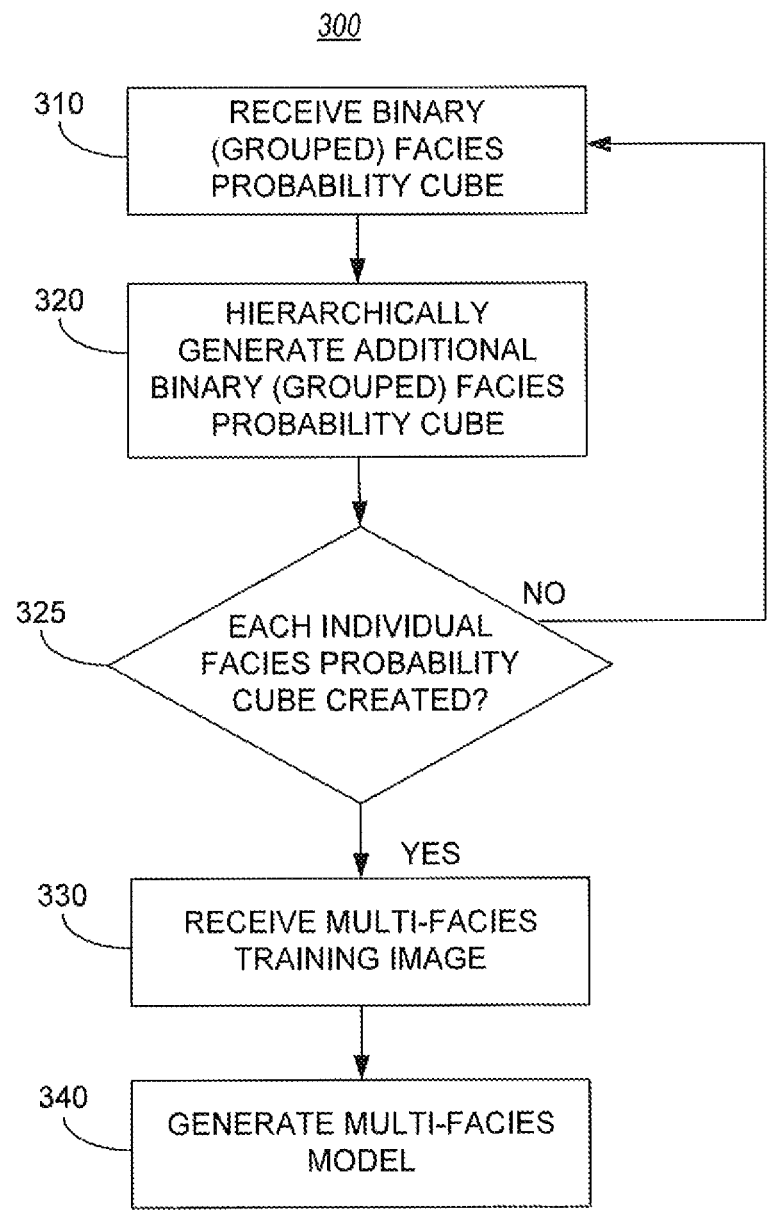
FIG. 3 illustrates a flow diagram of a method for generating a multiple facies model constrained by a facies probability cube in accordance with implementations of various techniques described herein.

FIG. 3 illustrates a flow diagram of a method 300 for generating a multiple facies model constrained by a facies probability cube in accordance with implementations of various techniques described herein. The following description of method 300 is made with reference to method 200 above and diagram 1500 of FIG. 15. In one implementation, method 300 may be performed by a computer application.

Method 200 generates a facies probability cube by targeting one facies at a time. As a result, the probability cubes reflect the spatial variation of the likelihood of the selected facies. In reservoir modeling, however, there are often more than two facies present within the earth. Users rarely build multiple facies probability cubes for each facies at one time due to the difficulty of making each facies probability cube consistent with each other. To overcome this difficulty, method 300 and method 400, described below, may be used to create a multiple facies model based on the facies probability cube generated by method 200.

At step 310, the computer application may receive a facies probability cube that may have been generated using method 200 described above. The facies probability cube as described in method 200 may also be described as a binary (grouped) facies probability cube that includes information pertaining to a single facies. For instance, the binary facies probability cube may be used to indicate the probability of whether sand exists or does not exist in an area of the earth.

At step 320, after receiving the binary facies probability cube, the computer application may hierarchically generate an additional binary facies probability cube. As such, the computer application may recursively generate an additional dimensions or facies on the binary facies cube received at step 310. In this manner, the computer application may repeat method 200 using the received binary facies probability cube. However, when repeating method 200, the computer application may generate a quaternary facies probability cube to indicate the presence of an additional facies. For instance, if the facies probability cube received at step 310 represented locations where sand exists in the survey area, at step 320, the computer application may recursively evaluate the locations where sand exists in the received facies probability cube such that the sand locations will be categorized into a different facies such as levees, crevasse or background.

Method 300 may be repeated using the newly generated binary facies probability cube to determine another binary facies probability cube. As such, method 300 may be repeated until each individual facies probability cube has been created. At step 325, the computer application may determine whether each individual facies probability cube has been created. If each individual facies probability cube has been created, the computer application may proceed to step 330. If each individual facies probability cube has not been created, the computer application may return to step 310.

Figure 13:
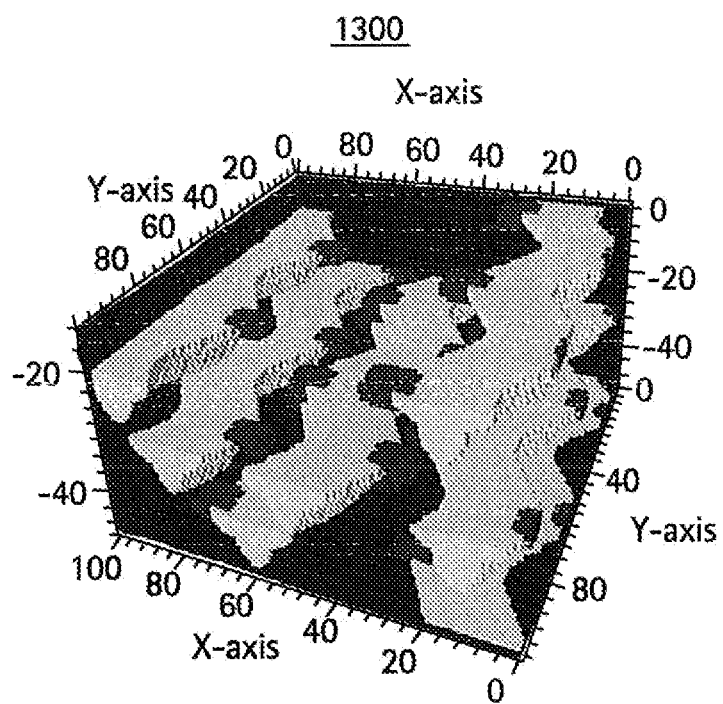
FIG. 13 illustrates an example of four facies training image in accordance with implementations of various techniques described herein.

After creating each individual facies probability cube, at step 330, the computer application may receive a multi-facies training image. FIG. 13 illustrates an example of a multi-facies training image.

Figure 14:
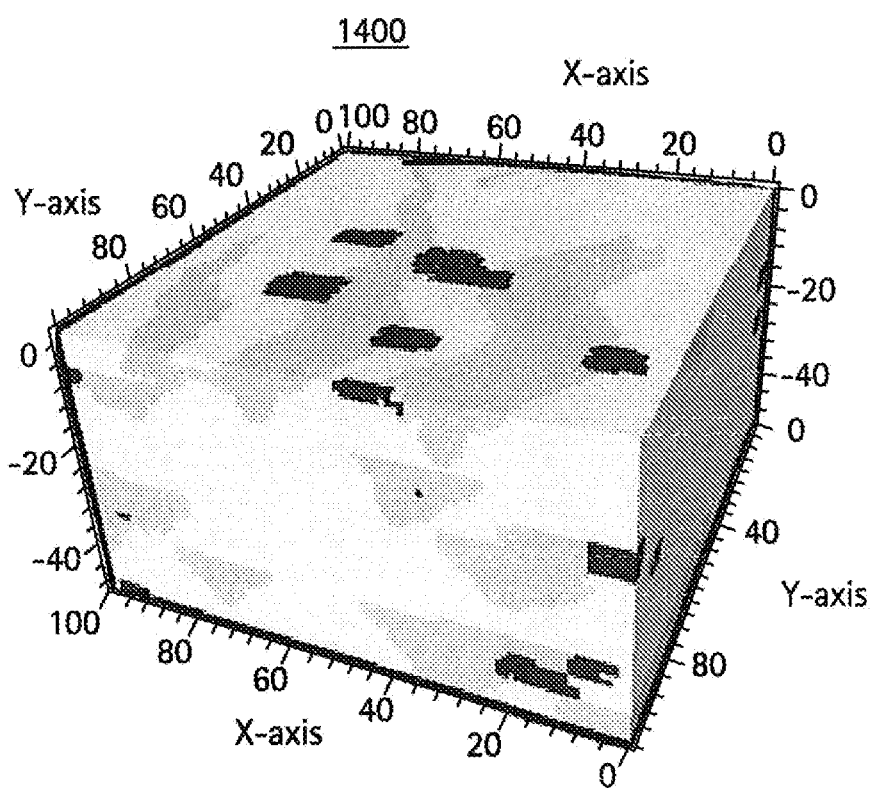
FIG. 14 illustrates an example of a reservoir model with four facies in accordance with implementations of various techniques described herein.

At step 340, the computer application may generate a multiple-facies model based on each individual facies probability cube. FIG. 14 illustrates an example of a multiple-facies model. FIG. 15 illustrates how the multi-facies model 1540 is generated.

Figure 4:
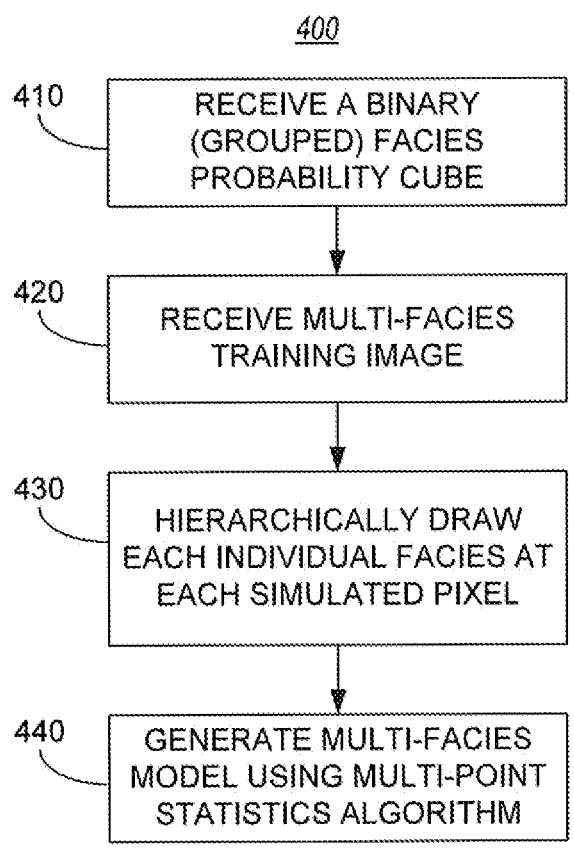
FIG. 4 illustrates a flow diagram of a method for generating a multiple facies model constrained by a facies probability cube in accordance with implementations of various techniques described herein.

FIG. 4 illustrates a flow diagram of a method 400 for generating a multiple facies model constrained by a facies probability cube in accordance with implementations of various techniques described herein. The following description of method 400 is made with reference to method 200 above and diagram 1500 of FIG. 15. In one implementation, method 400 may be performed by a computer application.

At step 410, the computer application may receive a binary (grouped) facies probability cube that may have been generated using method 200 described above. The facies probability cube may include the highest level or category of the facies group.

At step 420, the computer application may receive a multi-facies training image. The multi-facies training image may be used to obtain a multi-facies model using a multi-point statistics algorithm. As mentioned above, FIG. 13 illustrates an example of a multi-facies training image.

At step 430, the computer application may hierarchically draw each individual facies at each simulated pixel in the binary facies probability cube. In one implementation, in order to hierarchically draw each individual facies, the computer application may use user-defined proportions for each facies of the multi-facies model. Using the defined proportions, the binary facies probability cube of step 410 and the training image of step 420, at step 440, the computer application may generate the multi-facies model using the multi-point statistics algorithm, described in Conditional Simulation of Complex Geological Structures Using Multiple Point Statistics. Mathematical Geology, v. 34, p. 1-22 (Strebelle, 2002). In one implementation, method 400 may be more practical when there are distinct and clear facies associations in the training image. By generating the multi-facies model using the multi-point statistics algorithm, the computer application may generate the multi-facies model once without using a hierarchical refining process as described in method 300. As mentioned above, FIG. 15 illustrates how the multi-facies model 1540 is generated.

Generally, method 300 may be used when many facies exist and one-level facies grouping is not enough to resolve the variability of spatial facies heterogeneity, but it calls for many intermediate steps. Conversely, method 400 may be more practical when there are distinct and clear facies associations in the training images. As such, method 400 may recursively draw facies at each simulated pixel/voxel during the sequential simulation by the following rules:

Assume there are $A_1, A_2 \ldots A_M$ (M>2) facies and group them into 2 groups: $A=A_1+A_2+\ldots+A_s$ and $\sim A=A_s+1+A_s+2+\ldots+A_M$.

For a conditioning data B searched within a neighborhood of the currently simulated pixel/voxel, read the $P(A|B) = P(A_1|B)+P(A_2|B)+\ldots+P(A_s|B)$ from the search tree and combine with the underlying facies probability value (soft data) noted as $P(A|C)$ using the Tau model, described in Journel, A. G., 2002, Combining Knowledge From Diverse Sources: An Alternative to Traditional Data Independence Hypotheses. Mathematical Geology, v. 34, p. 573-596 (Journel, 2002), to obtain $P(A|B, C)$.

Draw facies from $P(A|B, C)$ and $P(\sim A|B, C)$. If facies group A is drawn, renormalize $P(A_1), P(A_2), \ldots, P(A_s)$ to 1.0 and draw from these S facies; if facies group ~A is drawn, renormalize $P(A_s+1), P(A_s+2), \ldots, P(A_m)$ to 1.0 and draw from these M-S facies.

Assign the simulated facies, which is one of $A_1, A_2 \ldots A_M$, to the simulated pixel/voxel and then move to the next simulation pixel/voxel.

Figure 6:
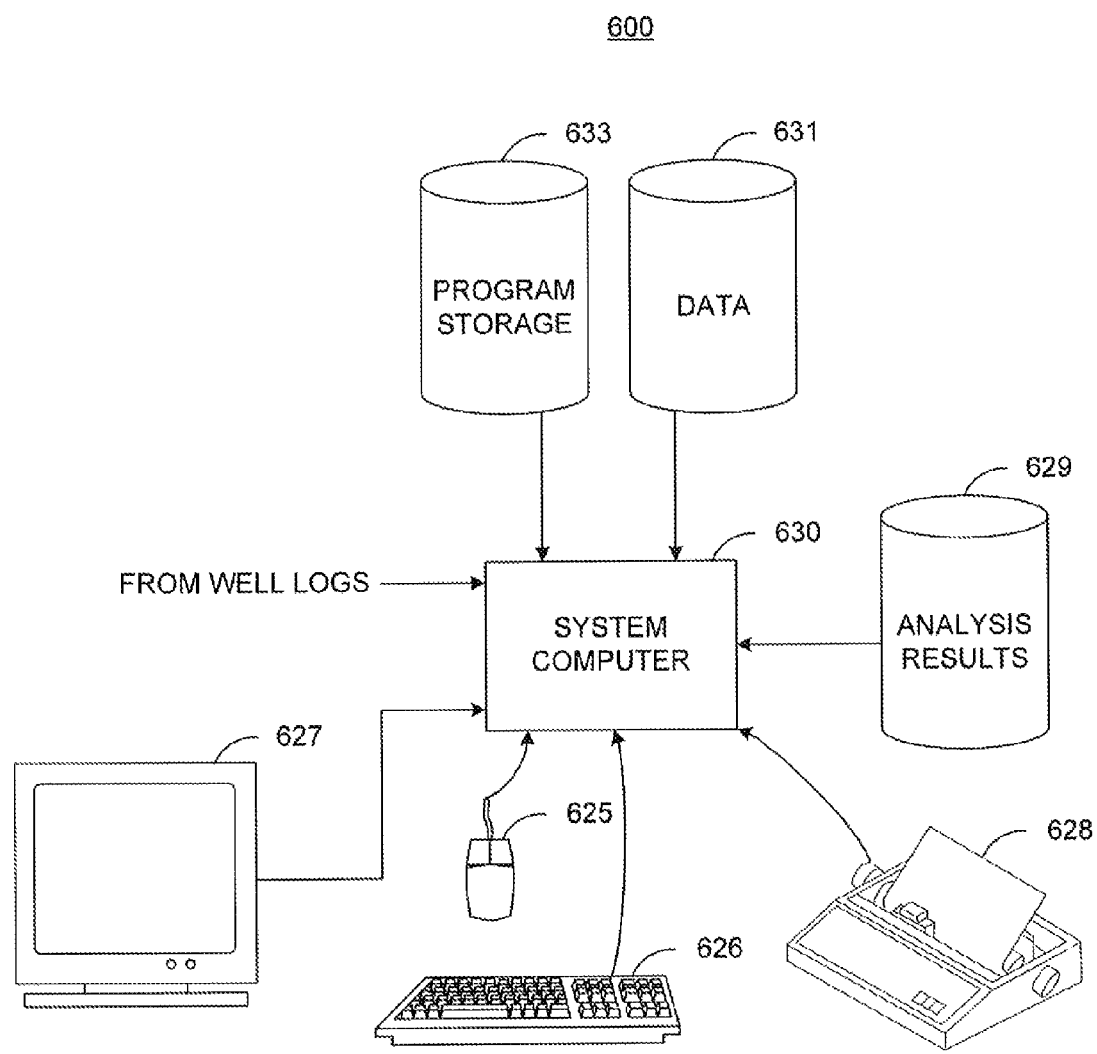
FIG. 6 illustrates a computer network into which implementations of various technologies described herein may be implemented.

FIG. 6 illustrates a computer network 600 into which implementations of various technologies described herein may be implemented. The computing system 600 (system computer) may include one or more system computers 630, which may be implemented as any conventional personal computer or server. However, those skilled in the art will appreciate that implementations of various techniques described herein may be practiced in other computer system configurations, including hypertext transfer protocol (HTTP) servers, hand-held devices, multiprocessor systems, microprocessor-based or programmable consumer electronics, network PCs, minicomputers, mainframe computers, and the like.

The system computer 630 may be in communication with disk storage devices 629, 631, and 633, which may be external hard disk storage devices. It is contemplated that disk storage devices 629, 631, and 633 are conventional hard disk drives, and as such, will be implemented by way of a local area network or by remote access. Of course, while disk storage devices 629, 631, and 633 are illustrated as separate devices, a single disk storage device may be used to store any and all of the program instructions, measurement data, and results as desired.

In one implementation, well facies logs may be stored in disk storage device 631. The system computer 630 may retrieve the appropriate data from the disk storage device 631 to predict effective permeabilities according to program instructions that correspond to implementations of various techniques described herein. The program instructions may be written in a computer programming language, such as C++, Java and the like. The program instructions may be stored in a computer-readable medium, such as program disk storage device 633. Such computer-readable media may include computer storage media and communication media. Computer storage media may include volatile and non-volatile, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the system computer 630. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

In one implementation, the system computer 630 may present output primarily onto graphics display 627, or alternatively via printer 628. The system computer 630 may store the results of the methods described above on disk storage 1029, for later use and further analysis. The keyboard 626 and the pointing device (e.g., a mouse, trackball, or the like) 625 may be provided with the system computer 630 to enable interactive operation.

The system computer 630 may be located at a data center remote from the region were the earth formations were obtained from. The system computer 630 may be in communication with the logging device described in FIG. 1 (either directly or via a recording unit, not shown), to receive signals indicating the measurements on the earth formations. These signals, after conventional formatting and other initial processing, may be stored by the system computer 630 as digital data in the disk storage 631 for subsequent retrieval and processing in the manner described above. In one implementation, these signals and data may be sent to the system computer 630 directly from sensors, such as well logs and the like. When receiving data directly from the sensors, the system computer 630 may be described as part of an in-field data processing system. In another implementation, the system computer 630 may process seismic data already stored in the disk storage 631. When processing data stored in the disk storage 631, the system computer 630 may be described as part of a remote data processing center, separate from data acquisition. The system computer 630 may be configured to process data as part of the in-field data processing system, the remote data processing system or a combination thereof. While FIG. 6 illustrates the disk storage 631 as directly connected to the system computer 630, it is also contemplated that the disk storage device 631 may be accessible through a local area network or by remote access. Furthermore, while disk storage devices 629, 631 are illustrated as separate devices for storing input seismic data and analysis results, the disk storage devices 629, 631 may be implemented within a single disk drive (either together with or separately from program disk storage device 633), or in any other conventional manner as will be fully understood by one of skill in the art having reference to this specification.

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for generating one or more geological models for oil field exploration, comprising:
   receiving one or more well facies logs, a vertical facies proportion curve, a lateral proportion map, a variogram model and a global target histogram;
   generating a facies probability cube using a modified Sequential Gaussian Simulation (SGSIM) algorithm, the well facies logs, the vertical facies proportion curve, the lateral proportion map and the variogram model;
   performing an inverse normal score transform in Gaussian space to the facies probability cube to match the facies probability cube to the global target histogram; and
   generating the one or more geological models based on the matched facies probability cube with a computer.

2. The method of claim 1, wherein the vertical facies proportion curve is generated based on an interpretation of the one or more well facies logs.

3. The method of claim 1, wherein the lateral proportion map is obtained by interpolating one or more facies proportions from the one or more well facies logs.

4. The method of claim 1, wherein the lateral proportion map is obtained by calibrating one or more seismic interpretations of the one or more well facies logs.

5. The method of claim 1, wherein the variogram model is derived based on the vertical facies proportion curve and the lateral facies proportion map.

6. The method of claim 1, wherein the variogram model is a Gaussian variogram model.

7. The method of claim 1, wherein the global target histogram is a U-shaped beta distribution.

8. The method of claim 7, wherein receiving the global target histogram comprises receiving a parameter controlled contrast (c) that is associated with a variance value for the beta distribution.

9. The method of claim 1, wherein generating the facies probability cube using the modified Sequential Gaussian Simulation (SGSIM) algorithm comprises:
(a) transforming well facies data into a plurality of normal score values, wherein the well facies data is obtained from the well facies logs;
(b) selecting a random pixel in a model of the facies probability cube;
(c) determining a kriging mean and a kriging variance for the random pixel based on the plurality of normal score values at the random pixel;
(d) scaling the kriging mean based on a difference between a running facies proportion, a target facies proportion at a Z-layer on the random pixel, the vertical proportion curve, the lateral proportion map or combinations thereof;
(e) constructing a normal distribution value at the random pixel based on the scaled kriging mean and the kriging variance;
(f) adding the normal distribution value to the random pixel in the model; and
(g) back transforming the normal distribution value at the random pixel.

10. The method of claim 9, further comprising repeating steps (a)-(g) for each pixel in the model of the facies probability cube.

11. The method of claim 1, further comprising:
hierarchically generating one or more additional facies probability cube;
receiving a multi-facies training image; and
generating a multi-facies model based on the additional facies probability cubes and the multi-facies training image.

12. The method of claim 1, further comprising:
receiving a multi-facies training image;
hierarchically drawing each individual facies in the facies probability cube; and
generating a multi-facies model using multi-point statistics, the multi-facies training image and each individual facies in the facies probability cube.

13. A non-transitory computer-readable medium for generating one or more geological models for oil field exploration, the computer-readable medium having stored thereon computer-executable instructions which, when executed by a computer, cause the computer to:
receive one or more well facies logs, a vertical facies proportion curve, a lateral proportion map, a variogram model and a global target histogram;
generate a facies probability cube using a modified Sequential Gaussian Simulation (SGSIM) algorithm, the well facies logs, the vertical facies proportion curve, the lateral proportion map and the variogram model;
perform an inverse normal score transform in Gaussian space to the facies probability cube to match the facies probability cube to the global target histogram; and
generate the one or more geological models based on the matched facies probability cube.

14. The non-transitory computer-readable medium of claim 13, wherein the computer-executable instructions which, when executed by the computer, cause the computer to generate the facies probability cube using the modified Sequential Gaussian Simulation (SGSIM) algorithm comprises computer-executable instructions, which, when executed by the computer, cause the computer to:
(a) transform well facies data into a plurality of normal score values, wherein the well facies data is obtained from the well facies logs;
(b) select a random pixel in a model of the facies probability cube;
(c) determine a kriging mean and a kriging variance for the random pixel based on the plurality of normal score values at the random pixel;
(d) scale the kriging mean based on a difference between a running facies proportion, a target facies proportion at a Z-layer on the random pixel, the vertical proportion curve, the lateral proportion map or combinations thereof;
(e) construct a normal distribution value at the random pixel based on the scaled kriging mean and the kriging variance;
(f) add the normal distribution value to the random pixel in the model; and
(g) back transform the normal distribution value at the random pixel.

15. The non-transitory computer-readable medium of claim 14, wherein the kriging mean is scaled according to:

$$m_{sk}^{*new}(i,j,k) = m_{sk}^{*}(i,j,k) + \frac{\lambda}{1-\lambda}\left(\frac{VPC(k)-p^{*}(k)}{\sigma_T}\right) + \frac{\lambda}{1-\lambda}\left(\frac{LPM(i,j)-p^{*}(i,j)}{\sigma_T}\right)$$

where $m_{sk}^{*}(i,j,k)$ is the kriging mean at pixel $(i,j,k)$, $p(k)^{*}$ is the running facies proportion at the k-th Z-layer, $VPC(k)$ is proportion read at the k-th Z-layer from the vertical proportion curve, $\lambda$ is a servo factor in $[0, 1]$ that indicates the correction strength, $m_{sk}^{*new}(i,j,k)$ the scaled kriging mean, $\sigma_T$ is a standard deviation of the global histogram, i.e., $\sigma_T = \sqrt{c \times p \times (1-p)}$, wherein p denotes the proportion of a particular facies in the facies probability cube and c is a user defined tuning factor or parameter controlled contrast and $LPM(i,j)$ is a lateral proportion at pixel location $(i, j)$, which can be read from the lateral proportion map, and $p^{*}(i,j)$ is a running facies proportion calculated from the column at $(i, j)$.

16. The non-transitory computer-readable medium of claim 14, wherein the kriging mean is scaled according to:

$$m_{sk}^{*new}(i,j,k) = m_{sk}^{*}(i,j,k) + \frac{\lambda}{1-\lambda}\left(\frac{VPC(k)-p^{*}(k)}{\sigma_T}\right)$$

where $m_{sk}^{*}(i,j,k)$ is a kriging mean at pixel $(i,j,k)$, $p(k)^{*}$ is the running facies proportion at the k-th Z-layer, $VPC(k)$ is the proportion read at the k-th Z-layer from the vertical proportion curve, $\lambda$ is a servo factor in $[0, 1]$ that indicates the correction strength, $m_{sk}^{*new}(i,j,k)$ is the scaled kriging mean, and $\sigma_T$ is a standard deviation of the global histogram, i.e., $\sigma_T=\sqrt{c\times p\times(1-p)}$, wherein p denotes the proportion of a particular facies in the facies probability cube and c is a user defined tuning factor or parameter controlled contrast.

17. A system, comprising:
a processor; and
a memory comprising program instructions executable by the processor to:
- receive one or more well facies logs, a vertical facies proportion curve, a lateral proportion map, a variogram model and a global target histogram;
- generate a facies probability cube using a modified Sequential Gaussian Simulation (SGSIM) algorithm, the well facies logs, the vertical facies proportion curve, the lateral proportion map and the variogram model;
- perform an inverse normal score transform in Gaussian space to the facies probability cube to match the facies probability cube to the global target histogram; and
- generate one or more geological models based on the matched facies probability cube, wherein the one or more geological models are used for oil field exploration.

18. The system of claim 17, wherein the global target histogram is a U-shaped beta distribution.

19. The system of claim 17, the variogram model is a spherical variogram model, an exponential variogram model, a Gaussian variogram model or a power variogram model.

* * * * *